Figure 1:
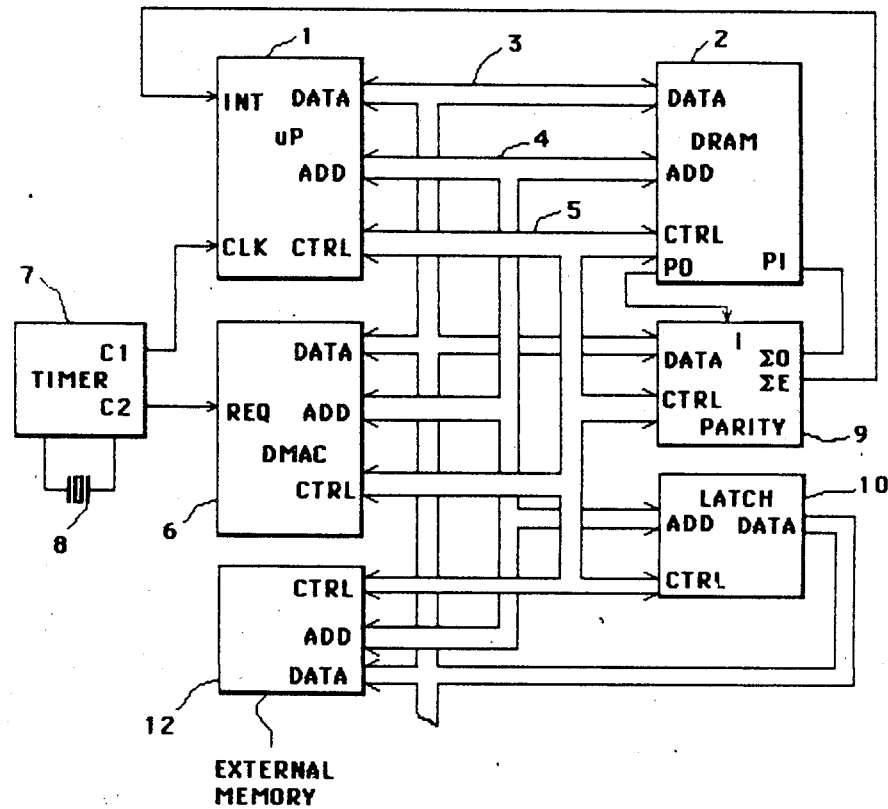

United States Patent [19]

Ramsay et al.

[11] Patent Number: 4,682,328
[45] Date of Patent: Jul. 21, 1987

[54] DYNAMIC MEMORY REFRESH AND PARITY CHECKING CIRCUIT

[75] Inventors: John R. Ramsay, Herndon, Va.; Zbigniew B. Styrna, Kanata, Canada

[73] Assignee: Mitel Corporation, Ontario, Canada

[21] Appl. No.: 781,023

[22] Filed: Sep. 27, 1985

[30] Foreign Application Priority Data

Aug. 15, 1985 [CA] Canada ................................. 488829

[51] Int. Cl.⁴ ...................... G11C 29/00; G06F 11/10
[52] U.S. Cl. ........................................ 371/13; 371/51
[58] Field of Search ............................ 371/13, 38, 51; 365/200, 201, 222

[56] References Cited

U.S. PATENT DOCUMENTS

| | | | |
|---|---|---|---|
| 4,183,096 | 1/1980 | Cenker et al. ...................... | 365/222 |
| 4,355,393 | 10/1982 | Kubo et al. .............................. | 371/51 |
| 4,380,812 | 4/1983 | Ziegler, II et al. .................... | 371/38 |
| 4,493,081 | 1/1985 | Schmidt ............................. | 371/13 X |

FOREIGN PATENT DOCUMENTS

| | | |
|---|---|---|
| 8403968 | 10/1984 | World Int. Prop. O. . |
| 2075730 | 11/1981 | United Kingdom . |
| 2080586 | 2/1982 | United Kingdom . |
| 2103850 | 2/1983 | United Kingdom . |

*Primary Examiner*—Charles E. Atkinson
*Attorney, Agent, or Firm*—Antonelli, Terry & Wands

[57] ABSTRACT

A circuit for use in conjunction with a microprocessor for refreshing, checking and correcting data signals stored in a dynamic memory. The circuit utilizes a direct memory access controller for transferring data signals stored in successive locations of the dynamic memory to a non-existent peripheral. Data signals appearing on a data bus as a result of the data transfer, are applied to a parity checking circuit for generating an interrupt signal to the microprocessor in response to detection of parity errors in the data signal. The microprocessor then performs a data recovery routine in which correct versions of the data signal stored in a non-volatile memory, are transferred for storage in the dynamic memory under control of a microprocessor. Parity errors in data signals stored in the dynamic memory are thus corrected prior to being accessed by the microprocessor.

12 Claims, 1 Drawing Figure

DYNAMIC MEMORY REFRESH AND PARITY CHECKING CIRCUIT

This invention relates in general to computer memory circuits, and in particular to a circuit for refreshing, checking and correcting data signals stored in a dynamic memory.

Random access memories (RAMS) are comprised of storage cells consisting typically of either bipolar TTL or MOS transistors. A storage cell comprised of TTL transistors operates statically, such that a data signal stored therein is not lost provided power is continuously applied to the transistors. On the other hand, a variety of MOS transistor implemented storage cells operate dynamically, and random access memories comprised of such dynamic storage cells are known as DRAMs. Data signals are stored on parasitic capacitances between gate and source terminals of the MOS transistors. A logic high level signal is characterized by a predetermined amount of electrical charge being stored on the capacitance. In the event the stored data signal is not accessed (i.e., read by a microprocessor etc.) over a predetermined amount of time, the charge on the capacitor decreases as a result of leakage currents, such that the logic high level signal may become indistinguishable from a logic low level signal, resulting in lost data.

Circuits have been constructed for refreshing the stored data signal before the decrease in capacitor charge becomes critical. Such prior art DRAM refresh circuits were typically fabricated using NMOS components comprising address generators and internal counters, etc., and generated an approximately 1 microsecond refresh pulse evey 2 milliseconds for application to every memory cell in the DRAM.

The NMOS components have been found to be quite slow and expensive, and hence the prior art DRAM refresh circuits are typically very complex and large, occupying considerable circuit board area.

As an alternative to using dedicated refresh circuitry, a prior art DRAM refresh technique was devised wherein a microprocessor was interrupted approximately every 2 milliseconds for executing a refresh subroutine which caused 128 successive DRAM memory locations to be read. An obvious disadvantage of this technique is that a considerable amount of time is required for the microprocessor to refresh the DRAM locations, which could otherwise be utilized to perform higher priority functions.

In order to ensure data integrity, data signals being read by the microprocessor (i.e., from DRAM) are usually checked for parity errors due to the aforementioned data signal loss resulting from leakage currents.

Prior art parity checking and correcting circuits are well known. However, such prior art parity checking circuits were found to be quite expensive, they occupied substantial circuit board area and typically operated independently of the aforementioned refresh circuits. For instance, refresh circuits usually operate continuously and cyclically in order to refresh the DRAM contents (independently of the microprocessor reading data from the DRAM), whereas parity error detection and correction circuits are typically enabled only at the time the microprocessor reads data from memory.

According to the prior art, a full microprocessor bus cycle was usually required after execution of each microprocessor memory read instruction in order to perform a parity check on the data. In the event of detection of an error, a system reset was performed, resulting in catastrophic system failure since data stored in accumulators or internal registers of the microprocessor are typically lost, and in the event the microprocessor is controlling interconnections in a PABX or other telecommunications systems, the connections are lost.

According to the present invention, a direct memory access controller (DMAC) is utilized for refreshing DRAM memory locations by performing a memory-to-"non-existent" peripheral data transfer. The DMAC is preferably programmed for periodically acquiring control of data and address buses from the microprocessor, reading a location of DRAM and storing it in a non-existent peripheral (i.e., a defined peripheral address for which there is no corresponding peripheral). Consequently, the memory cells associated with the DRAM location are refreshed as a result of being read by the DMAC.

As with the first mentioned prior art DRAM refresh circuit, the present invention refreshes DRAM independently of the microprocessor reading the DRAM and hence overcomes the disadvantage of the latter mentioned prior art DRAM refresh technique which required substantial microprocessor time. However, unlike the first mentioned prior art circuit, the DMAC is an inexpensive semiconductor chip requiring typically very little additional circuitry, and operates at very high speed.

Also, according to the present invention, data signals appearing on the data bus as a result of being read by the DMAC are applied to a parity checking circuit. In the event of detection of a parity error, a signal is generated for interrupting the microprocessor which then executes a recovery routine for restoring the erroneous data signal to its correct form. This can be accomplished, for instance, by downloading from a floppy disk etc.

Because parity checking and data recovery are performed during DRAM refresh, as opposed to the prior art technique of checking for errors only during a microprocessor read instruction, parity errors are detected and corrected prior to the microprocessor reading the data signals. Hence, the frequency of occurrences of system resets is substanially reduced over prior art parity detection and correction circuits.

The DRAM refresh and parity checking circuit of the present invention conforms to modern day microcomputer component requirements of high speed and low cost, and occupies little circuit board space. In fact, it has been found that whereas prior art NMOS DRAM refresh circuits utilized approximately 25% of the microprocessor bus cycles, a successful embodiment of the present invention utilizes typically only 6.4% of the bus cycles.

In general, the invention is a circuit for refreshing, checking and correcting data signals stored in a dynamic memory, comprising a data bus for connection to the dynamic memory, a direct memory access controller for connection to the memory and the data bus, for periodically reading successive ones of the data signals such that the data signals appear on the data bus, a parity checking circuit connected to the data bus, for detecting parity errors in the data signals and generating interrupt signals in response thereto, and recovery circuitry connected to the data bus and the parity checking circuit, for receiving the interrupt signals and generating and storing correct versions of the data signals in the dynamic memory in response thereto, whereby successive ones of the data signals are refreshed as a result of being read by the direct memory access controller and parity errors are corrected as a result of the recovery circuitry storing correct versions of the data signals in the memory.

More particularly, the invention is a circuit for refreshing, checking and correcting data signals stored in a dynamic memory, comprising a direct memory access controller for periodically reading successive ones of the data signals, a parity checking circuit connected in a circuit to the direct memory access controller for detecting parity errors in the data signals read by the direct memory access controller and generating interrupt signals in response thereto, a non-volatile memory circuit for storing correct versions of the data signals, and a microprocessor connected to the non-volatile memory circuit, the dynamic memory and the parity checking circuit for receiving the interrupt signals and reading the correct versions of the data signals from the non-volatile memory circuit and storing the correct versions in the dynamic memory in response thereto, whereby the data signals stored in the dynamic memory are refreshed in response to being read by the direct memory access controller and corrected in response to the microprocessor storing the correct versions of the data signals in the dynamic memory.

The invention is also a method for refreshing, checking and correcting data signals stored in a dynamic memory, comprising the steps of periodically transferring data signals stored in successive locations of the dynamic memory to a non-existent peripheral, and detecting parity errors in the transferred data signals and storing correct versions of the data signals in the dynamic memory in response thereto, whereby the data signals are refreshed in response to being transferred to the non-existent peripheral and corrected in response to the correct versions of the data signals being stored in the dynamic memory.

A better understanding of the invention will be obtained by reference to the detailed description below, and to the following drawing, in which:

FIG. 1 is a schematic diagram of a DRAM refresh, parity checking and correcting circuit according to a preferred embodiment of the invention.

With reference to FIG. 1, a microprocessor 1 is shown connected to a dynamic random access memory, DRAM 2, via data, address and control buses 3, 4 and 5 respectively. Microprocessor 1 typically addresses data in DRAM 2 via address bus 4. Data is read from or written to DRAM 2 in response to a predetermined sequence of signals on the control bus 5, in a well known manner. Typical ones of the control signals include read/write, chip select and valid memory address signals.

A direct memory access controller DMAC 6 is connected to the data, address and control buses 3, 4 and 5 respectively. Dynamic memory access controllers are well known in the art for performing data transfers between peripherals and memory in a microprocessor system. However, according to the present invention, DMAC 6 is utilized for refreshing locations of DRAM 2 by transferring data from DRAM 2 to a non-existent peripheral, (i.e. a peripheral address in the microprocessor memory map for which there is no corresponding peripheral).

A timing circuit 7 generates clock signals in response to receiving signals from an oscillator circuit 8. In particular, timing circuit 7 generates a clock signal from a C1 output thereof connected to a CLK input of microprocessor 1, for synchronizing operation of the microprocessor in a well known manner. A further clock signal is generated from a C2 output of timing circuit 7 for application to a DMA request input REQ, of DMAC 6, for periodically generating DMA transfer requests.

In operation, the circuit is initially powered-up such that microprocessor 1 executes an initialization, or bootstrap program in a well known manner. Microprocessor 1 initalizes DMAC 6 under control of the initialization program by loading a series of instructions, as well as first and last valid DRAM memory addresses and the non-existent peripheral address, into internal data registers of DMAC 6. The loaded instructions cause DMAC 6 to be configured for what is termed "cycle steal chain mode" operation. In this mode of operation, the DMAC 6 effectively acquires control of, or "steals" control of the data and address buses 3 and 4 from the microprocessor 1 in response to receiving a DMA request signal from timing circuit 7. DMAC 6 then performs a data transfer from the DRAM 2 to the non-existent peripheral, described in further detail below. After data has been transferred from the last valid memory address of DRAM 2, DMAC 6 recycles to the first memory address according to the aforementioned "chain" mode of operation.

The microprocessor 1 also typically causes data to be stored in DRAM 2 from an external memory 12 such as an EPROM or floppy disc, under control of the initialization program. The external memory 12 has data, address and control inputs connected to the data, address and control busses 3, 4 and 5 respectively, in a well known manner.

Subsequent to execution of the initialization program, the microprocessor 1 typically executes one or more application programs under control of an operating system program whereby the data stored in DRAM 2 is periodically accessed, in a well known manner.

While the microprocessor 1 is executing the program, timing circuit 7 generates the aforementioned DMA request signals at a rate of preferably one request signal every 16 microseconds. DMAC 6 receives a first one of the DMA request signals and in response takes control of, or acquires "bus mastership" of the data and address buses 3 and 4 respectively. DMAC 6 then reads a data signal stored in the first valid memory address of DRAM 2 and attempts to store it in the non-existent peripheral. The process of reading the data signal stored in the memory location results in refreshing the associated capacitive memory cells. DMAC 6 then relinquishes bus mastership to the microprocessor 1, which continues execution of the program.

Approximately 16 microseconds later, a second DMA request signal is generated by timing circuit 7 and applied to the REQ input of DMAC 6. DMAC 6 again acquires bus mastership and causes memory cells associated with a second valid memory address of DRAM 2 to be refreshed, as described above.

The DMA data transfer from DRAM 2 to the non-existent peripheral is repeated until each successive location of DRAM 2 has been refreshed. Upon refreshing the last valid memory address location of DRAM 2, DMAC 6 recycles and begins refreshing DRAM 2 from the first valid memory address location, as discussed above.

The data signals appearing on data bus 3 are also applied to data inputs DATA, of a parity checking circuit 9. Parity checking circuit 9 has control inputs CTRL thereof connected to the control bus 5, and a parity bit input I connected to a parity bit output P0 of DRAM 2. An odd parity output ΣO is connected to a parity bit input P1 of DRAM 2, and an even parity output ΣE is connected to an interrupt input INT, of microprocessor 1.

During execution of the initialization program, parity checking circuit 9 generates a parity bit for each byte of data appearing on the data bus 3, in response to the data being stored in DRAM 2 from the external memory 12. The parity bits are transmitted from the ΣO output and applied to the P1 input of DRAM 2 so as to be stored therein. Parity bits are transmitted to and from parity checking circuit 9 via dedicated leads connected to the DRAM 2, and hence do not appear on the data bus 3.

During normal operation, (i.e. during execution of the one or more application programs subsequent to execution of the initialization program), parity checking circuit 9 detects the parity of a data signal appearing on data bus 3 as a result of being read by DMAC 6, and compares it with the stored parity bit received from DRAM 2. Parity checking circuit 9 thus determines the parity of a combination of the received data signal and its associated parity bit, and in the event of no parity error being detected, generates a logic high signal on the ΣO output thereof and a logic low signal on the ΣE output. However, in the event of detection of a parity error, the ΣE output goes to a high logic level thereby generating an interrupt signal for interrupting the microprocessor 1.

Interrupt signals appearing on the INT input of microprocessor 1 as a result of detection of even parity are masked during execution of the initialization program so that the microprocessor 1 is not interrupted.

The address in DRAM 2 of a data signal containing a parity error appears on address bus 4 (as a result of being addressed by DMAC 6), and is latched into an address input ADD of a failure location latch 10 in response to latch 10 receiving an enable signal from the control bus 5. An output of latch 10 is connected to data bus 3, for transmitting the latched address to the microprocessor 1.

Thus, in the event of detection of a parity error in a data signal appearing on data bus 3, parity checking circuit 9 generates an interrupt to microprocessor 1, which in turn reads the failure location address latched into failure location latch 10.

Next, a data recovery routine is implemented in microprocessor 1 for storing a correct version of the data signal stored in the external memory 12 (such as an EPROM, floppy disk or other non-volatile memory) in the location of DRAM 2 defined by the failure location address.

As discussed above, during execution of the operating system program, the microprocessor 1 typically reads and writes data from and to the DRAM 2. Parity checking circuit 9 generates a parity bit from the ΣO output thereof, in response to data being written to DRAM 2. The generated parity bit is loaded into DRAM 2 via the PI input thereof.

During normal operation, the interrupt input INT to microprocessor 1 is not masked, and data read from DRAM 2 is checked for parity errors, as described above with reference to the DMA refresh, and the microprocessor is interrupted in the event of detection of a parity error. A correct version of the data signal is then loaded into DRAM 2 pursuant to the recovery routine, as described above.

In a successful prototype of the invention, microprocessor 1 was a Motorola model 68000 microprocessor, DRAM 2 was comprised of 2 megabits of 64 k dynamic RAM chips organized into sixteen 128 kilobyte blocks, DMAC 6 was a Motorola model 68450 direct memory access controller and parity checking circuit 6 was a Texas Instruments model LS280 odd-/even parity generator/checker. Oscillator 8 was an approximately 16.384 megahertz crystal oscillator, and timing circuit 7 generated an approximately 8 megahertz clock signal from the C1 output thereof and an approximately 64 kilohertz DMA request signal from the C2 output thereof for requesting DMA transfers from the DMAC 6 every 16 microseconds.

In the successful prototype data bus 3 was 16 bits wide, such that 1 parity bit was calculated for each 8 bit byte. Hence, the ΣO output of parity checking circuit 9 generated 2 parity bits for storage in DRAM 2, which in the successful embodiment contained 18 bit data signals comprised of two 8 bit data words and two corresponding parity bits.

Dynamic RAMs such as DRAM 2 typically include address decoding circuitry for decoding addresses applied thereto from the address bus 4 and generating row and column memory cell select signals. According to the successful embodiment, a memory map of the microprocessor was organized to provide two appearances of DRAM 2; one at an address space of from 000000 hex to 1FFFFF hex, and the other at from 800000 hex to 9FFFFF hex. Addresses on address bus 4 were decoded using programmable logic arrays such that both row and column select signals were completely decoded in response to receiving an address in the first DRAM appearance, and each of the 16 banks were row selected, only one bank being column selected, in response to receiving an address in the second appearance of DRAM. Hence, only one bank applied a data signal to the data bus 3, yet all banks were refreshed in response to receiving the row select signal.

The microprocessor 1 utilized the first appearance to write and read data to and from DRAM 2, while DMAC 6 utilized the second appearance for performing the refresh. According to the successful prototype, DMAC 6 refreshed 128 locations (selected memory cell rows) approximately once every 2 milliseconds; one location being refreshed every approximately 16 microseconds.

In summary, the present invention utilizes a direct memory access controller for performing DRAM refresh without the use of sophisticated and expensive refresh circuitry. Data appearing on the data bus, as a result of being read by DMAC 6, is applied to a parity checking circuit for the detection and correction of parity errors. Thus, parity errors occurring in DRAM 2 are corrected prior to being read by the microprocessor, and the frequency of system resets is substantially reduced over prior art parity checking and correction circuits.

According to the successful prototype, DMAC 6 also contained an additional 3 DMA channels for performing standard memory-to-memory, peripheral-to-memory, and peripheral-to-peripheral data transfers. Hence, considerable economy of components was achieved through using the direct memory access controller in different functional capacities.

Persons skilled in the art and understanding this invention may now conceive of other embodiments or variations, using the principles of the invention, as described above.

For instance, additional error detection and correction circuitry can be employed as an alternative to executing the above mentioned data recovery routine, in order to further reduce the microprocessor time utilized for error detection and correction.

Timing circuit 7 can be adjusted to generate a DMA request once every 2 milliseconds, and DMAC 6 can be configured to perform a burst of 128 data transfers of contiguous memory locations of DRAM 2 to the non-existent peripheral, in response to receiving a DMA request signal. Hence, in the event a plurality of successive memory locations in DRAM 2 contain erroneous data, the microprocessor 1 is relieved of the task of performing successive time consuming recovery routines In addition, dedicated circuitry can be utilized for implementing the aforementioned recovery routine as opposed to the microprocessor 1. Or, as a further alternative, the DMAC 6 can be utilized to implement the recovery routine, in order to consume less microprocessor time.

All such variations and other embodiments of the invention are considered to be within the sphere and scope of the present invention as defined in the claims appended hereto.

We claim:

1. A circuit for refreshing, checking and correcting data signals stored in a dynamic memory, comprising:
   (a) a data bus for connection to said dynamic memory,
   (b) a direct memory access controller for connection to said memory and said data bus, for periodically reading successive ones of said data signals such that said data signals appear on said data bus,
   (c) a parity checking circuit, connected to said data bus, for detecting parity errors in said data signals and generating interrupt signals in response thereto,
   (d) recovery means connected to said data bus and said parity checking circuit, for receiving said interrupt signals and generating and storing correct versions of said data signals in said dynamic memory in response thereto, and
   (e) said recovery means being comprised of non-volatile memory means containing said correct versions of said data signals and means for retrieving said correct data signals from said non-volatile memory means and storing said correct data signals in said dynamic memory in response to receiving said interrupt signals,
   whereby successive ones of said data signals are refreshed as a result of being read by said direct memory access controller and parity errors are corrected as a result of said recovery means storing correct versions of said data signals in said memory.

2. A circuit as defined in claim 1, wherein said means for retrieving and storing said correct versions of said data signals is comprised of a microprocessor.

3. A circuit as defined in claim 2, further comprising a timer circuit for generating request signals to the direct memory access controller for causing said controller to periodically read said data signals stored in said memory.

4. A circuit as defined in claim 1 wherein said non-volatile memory means is a floppy disk.

5. A circuit as defined in claim 1 wherein said non-volatile memory means is an EPROM.

6. A circuit as defined in claim 1 further comprising a timer circuit for generating request signals to the direct memory access controller for causing said controller to periodically read said data signals stored in said memory.

7. A circuit as defined in claim 2, further comprising a timer circuit for generating request signals to the direct memory access controller for causing said controller to periodically read said data signals stored in said memory.

8. A circuit as defined in claim 2 wherein said non-volatile memory means is a floppy disk.

9. A circuit as defined in claim 2 wherein said non-volatile memory means is an EPROM.

10. A circuit tor refreshing, checking and correcting data signals stored in a dynamic memory, comprising:
    (a) a direct memory access controller for periodically reading successive ones of said data signals,
    (b) a parity checking circuit connected in a circuit to said direct memory access controller for detecting parity errors in said data signals read by said direct memory access controller and generating interrupt signals in response thereto,
    (c) non-volatile memory means for storing correct versions of said data signals, and
    (d) a microprocessor connected to said non-volatile memory means, said dynamic memory and said parity checking circuit for receiving said interrupt signals and reading said correct versions of said data signals from said non-volatile memory means and storing said correct versions in the dynamic memory in response thereto,
    whereby said data signals stored in the dynamic memory are refreshed in response to being read by said direct memory access controller and corrected in response to said microprocessor storing said correct versions of the data signals in said dynamic memory.

11. A circuit as defined in claim 10, further comprised of timer means for generating a clock signal for transmission to said direct memory access controller in order to synchronize operation thereof.

12. A method for refreshing, checking and correcting data signals stored in a dynamic memory, comprising the steps of:
    (a) periodically transferring data signals stored in successive locations of the dynamic memory to a non-existent peripheral,
    (b) detecting parity errors in said transferred data signals and generating interrupt signals in response thereto,
    (c) storing correct versions of said data signals in a non-volatile memory, and
    (d) receiving said interrupt signals and in response reading said correct versions of said data signals form said non-volatile memory and storing said correct versions in the dynamic memory,
    whereby said data signals are refreshed in response to being transferred to said non-existent peripheral and corrected in response to said correct versions of the data signals being stored in said dynamic memory.

* * * * *

UNITED STATES PATENT AND TRADEMARK OFFICE
CERTIFICATE OF CORRECTION

PATENT NO. : 4,682,328

DATED : July 21, 1987

INVENTOR(S) : RAMSAY et al

It is certified that error appears in the above-identified patent and that said Letters Patent is hereby corrected as shown below:

IN THE CLAIMS:

In claim 12, column 8, line 61, delete "form" and insert --from--.

Signed and Sealed this

Seventh Day of February, 1989

Attest:

DONALD J. QUIGG

*Attesting Officer*     *Commissioner of Patents and Trademarks*